(12) United States Patent
Miki

(10) Patent No.: US 6,400,011 B1
(45) Date of Patent: Jun. 4, 2002

(54) SEMICONDUCTOR LASER MODULE

(75) Inventor: Atsushi Miki, Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 08/467,052

(22) Filed: Jun. 6, 1995

(30) Foreign Application Priority Data

Jun. 6, 1994 (JP) ............................................. 6-147152

(51) Int. Cl.[7] .............................................. H01L 23/34
(52) U.S. Cl. ...................... 257/712; 257/713; 257/717; 257/720; 257/930
(58) Field of Search ................................. 257/712, 713, 257/717, 720, 930

(56) References Cited

U.S. PATENT DOCUMENTS

| | | | |
|---|---|---|---|
| 4,803,689 A | 2/1989 | Shibanuma | 372/36 |
| 5,005,178 A * | 4/1991 | Kluitmans et al. | 257/930 |
| 5,031,184 A * | 7/1991 | Greve et al. | 257/712 |
| 5,457,342 A * | 10/1995 | Herbst, II | 257/930 |

OTHER PUBLICATIONS

Yonetani et al, "Transmission Characteristics of DFB Laser Modules for Analog Applications", Journal of Lightwave Technology, vol. 11, No. 1, Jan. 1993, pp. 147–153.

* cited by examiner

Primary Examiner—Eddie Lee
Assistant Examiner—Matthew E. Warren
(74) Attorney, Agent, or Firm—McDermott, Will & Emery

(57) ABSTRACT

A semiconductor laser module includes a metal casing and a Peltier effect element mounted on the inner surface of the bottom wall of the metal casing by soldering. A Peltier effect element mounting region is provided in the inner surface of the metal casing in such a manner that the Peltier effect element mounting region is raised with respect to a region adjacent thereto.

4 Claims, 2 Drawing Sheets

SEMICONDUCTOR LASER MODULE

BACKGROUND OF THE INVENTION

1. Field of the Invention

The present invention relates to a semiconductor laser module, and more particularly to a structure of a semiconductor laser module including a Peltier effect element installed in a metal casing.

2. Description of the Related Art

FIG. 4 is a sectional view showing a typical arrangement of a conventional semiconductor laser module having a Peltier effect element.

The semiconductor laser module, as shown in FIG. 4, includes a semiconductor laser 1, an optical system, and an optical fiber 3. The semiconductor laser 1 is mounted on a substrate 6 together with a monitoring photo-diode 4 and a first lens 5. The substrate 6 is fixedly mounted in a metal casing 8 through a Peltier effect element 7. The metal casing 8 has a window in its one side wall which is sealed with a hermetical glass plate 9, and a second lens 10 is fixed outside the side wall by a lens holder 11. More specifically, one end of the lens holder 11 holding the lens 10 is fixedly secured to the side wall in such a manner that the lens holder is coaxial with the window. A ferrule holder 12 is secured to the other end of the lens holder 11, and a ferrule 13 into which one end portion of the optical fiber 3 is fixedly inserted is inserted into the ferrule holder 12.

FIG. 5 is an enlarged diagram showing the Peltier effect element 7 and its relevant components in the semiconductor laser module shown in FIG. 4.

The Peltier effect element 7, as shown in FIG. 5, is formed of a pair of ceramic plates 71 and 72 which are arranged in parallel with each other with a certain space between them; and a plurality of thermoelectric elements 74 held through electrodes 73 between the ceramic plates 71 and 72. The Peltier effect element 7 is fixedly provided inside the metal case 8; more specifically it is fixedly mounted on the inner surface of the bottom wall of the metal casing 8 with SnPb solder 2.

The conventional semiconductor laser module thus constructed has a problem that the solder 2 fixing the Peltier effect element 7 may flow over to the upper surface of the ceramic plate 71 so as to short-circuit the electrodes on the ceramic plate 71.

SUMMARY OF THE INVENTION

It is an object of the present invention to provide a semiconductor laser module capable of installing a Peltier effect element more certainly.

The semiconductor laser module according to the present invention includes a metal casing of the semiconductor laser module, a semiconductor laser and a Peltier effect element mounted on the inner surface of the metal casing by soldering. In the semiconductor laser module of the present invention, the metal casing has a Peltier effect element mounting region in the inner surface of the metal casing on which the Peltier effect element is mounted, the area of the Peltier effect element mounting region being substantially equal to that of the bottom surface of the Peltier effect element, and the Peltier effect element mounting region being with respected to a region adjacent thereto.

In the semiconductor laser module according to the present invention, a step is formed around the Peltier effect element mounting region so that the Peltier effect element mounting region is higher than the surrounding area. This structure prevents excess solder from short-circuiting the electrodes of the Peltier effect element when mounted. That is, the excess solder is not permitted to rise over the upper surface of the ceramic plate of the Peltier effect element.

BRIEF DESCRIPTION OF THE DRAWINGS

In the accompanying drawings.

PREFERRED EMBODIMENTS OF THE INVENTION

The preferred embodiments of the present invention will now be described with reference to the accompanying drawings.

Figure 1:
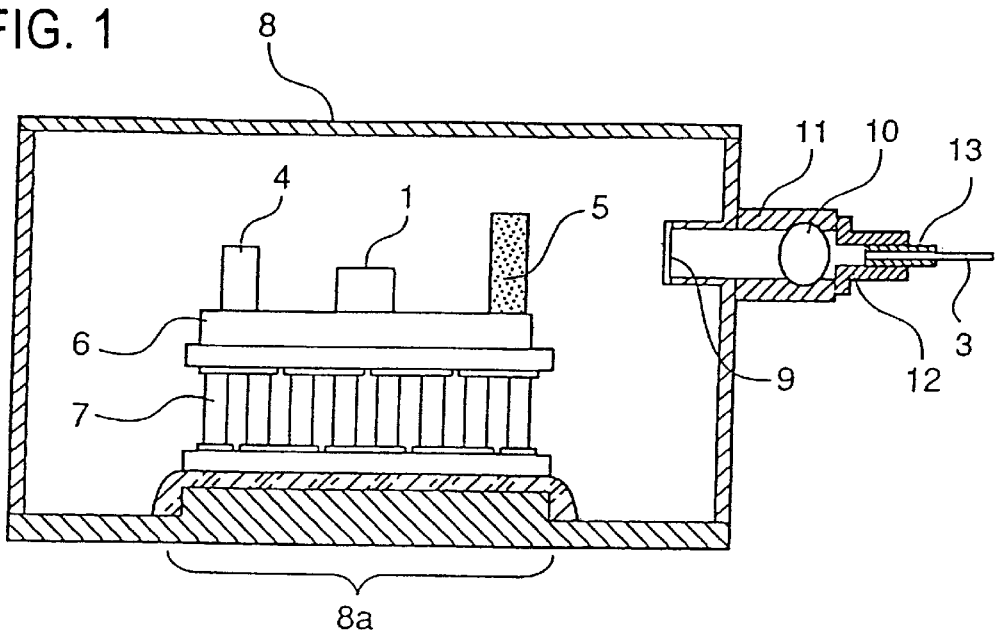
FIG. 1 is a diagram showing an embodiment of the arrangement of a semiconductor laser module according to the present invention.

FIG. 1 shows an embodiment of the arrangement of a semiconductor laser module according to the present invention. In FIG. 1, elements corresponding functionally to those which have been described with reference to FIG. 4 are designated by the same reference numerals or characters.

Figure 2:
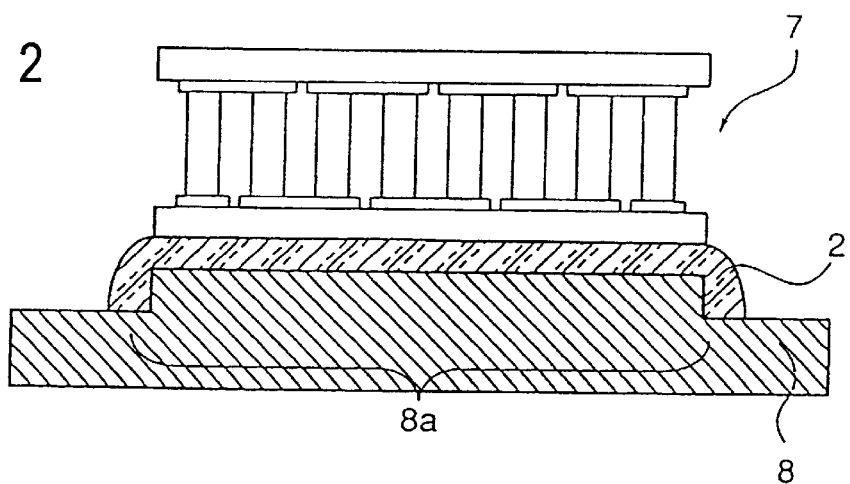
FIG. 2 is an enlarged diagram showing a portion where a Peltier effect element is installed in the semiconductor laser module.
Figure 4:
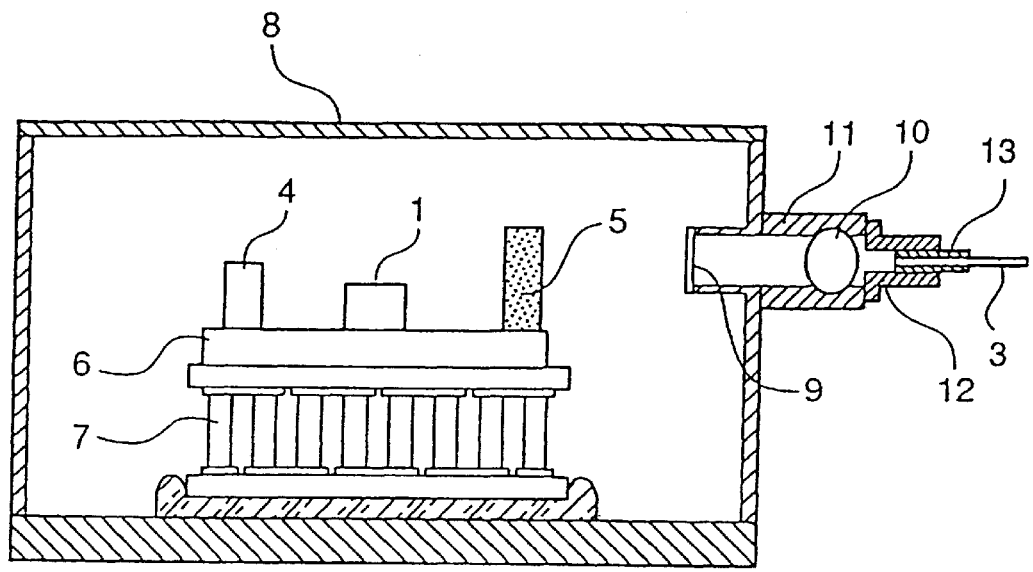
FIG. 4 is a diagram showing a typical example of the arrangement of a conventional semiconductor laser module.
Figure 5:
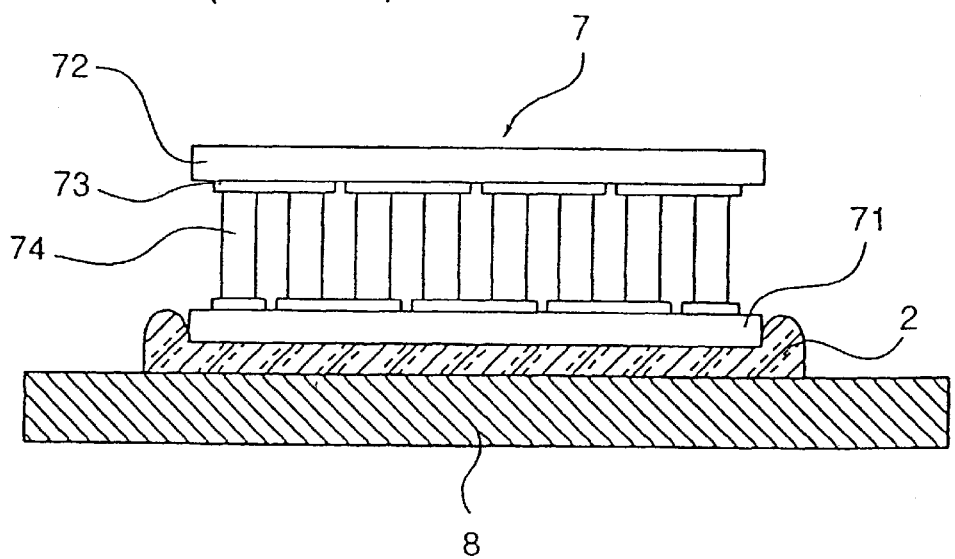
FIG. 5 is an enlarged diagram illustrating the mounting of a Peltier effect element in the conventional semiconductor laser module.

As is apparent from comparison of FIGS. 1 and 4, the fundamental arrangement of the semiconductor laser module of the present invention, shown in FIG. 1, is the same as the conventional semiconductor laser module shown in FIG. 4. However, it should be noted that, in the semiconductor laser module, the inner surface of the bottom wall of the casing 8 is partially raised to form a protrusion 8a in the inner surface on which the Peltier effect element 7 is mounted. Therefore, as shown in FIG. 2, even if the Peltier effect element 7 is fixedly mounted on the bottom wall of the metal casing 8 by soldering, the solder 2 between the bottom of the Peltier effect element 7 and the casing may be partially squeezed out and the solder 2 thus squeezed out flows down the step of the protrusion 8a, thus being prevented from flowing into the Peltier effect element 7.

Figure 3:
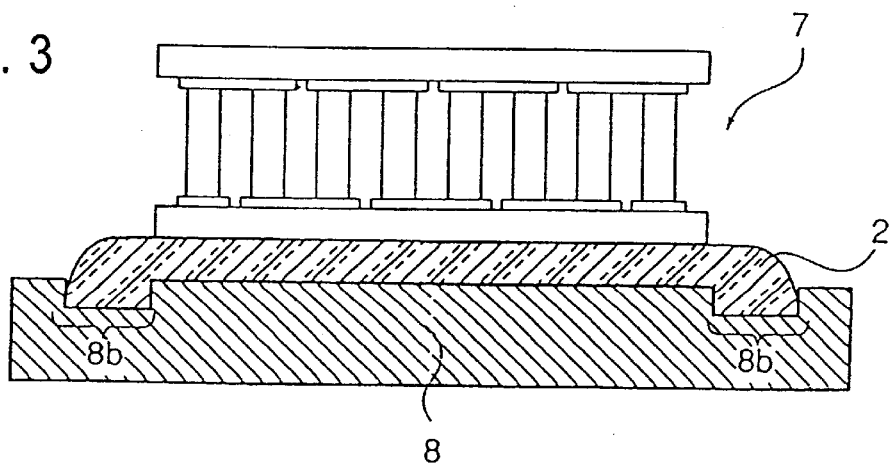
FIG. 3 is a diagram showing another embodiment of the arrangement of the semiconductor laser module according to the present invention.

FIG. 3 shows another embodiment of the arrangement of the semiconductor laser module according to the present invention.

The semiconductor laser module shown in FIG. 3 also has the same fundamental arrangement as the semiconductor laser modules shown in FIG. 4 and 1. However, it should be noted that a groove 8b is formed in the inner surface of the bottom wall of the metal casing 8 to define a Peltier effect element mounting region whose area is equal to the area of the bottom of the Peltier effect element 7. Thus, as with the first embodiment shown in FIG. 1, even if the Peltier effect element 7 is mounted on the bottom wall of the metal casing 8 by soldering, the solder 2 between the bottom of the Peltier effect element 7 and the casing 8 may be partially squeezed out and the solder thus squeezed out is caused to flow into the groove 8b, thus being prevented from flowing into the Peltier effect element. The groove 8b can be easily formed by machining the bottom wall of the casing 8.

In the above-described embodiments of the semiconductor laser module according to the invention, the Peltier effect element mounting region which is defined by the protrusion or the groove of the bottom wall of the metal casing should be substantially equal in area to the bottom of the Peltier effect element. In the case where the mounting region is smaller in area than the bottom of the Peltier effect element, the excess of solder is more positively caused to flow down. On the other hand, in the case where the Peltier effect element mounting region is slightly larger in area than the bottom of the Peltier effect element, the Peltier effect element should be scrubbed when mounted, to cause the excess of solder to flow down the step of the protrusion or to flow into the groove.

As is described above, in the semiconductor laser module of the present invention, the bottom wall of the casing is specially designed in configuration, which effectively eliminates the above-described difficulty which is caused by the excess of solder flowing over to the Peltier effect element.

It goes without saying that the structure of the semiconductor laser module of the invention effectively prevents the solder from flowing over to the Peltier effect element when the latter is fixedly mounted on the bottom of the metal casing by soldering, and improves the work efficiency in manufacture of the semiconductor laser module. In addition, it effectively prevents the occurrence of a trouble which is due to the solder which is softened when the module is electrically energized at a high temperature, and improves the reliability of the semiconductor laser module.

What is claimed is:

1. A semiconductor laser module, comprising:
    a metal casing of said semiconductor laser module;
    a semiconductor laser; and
    a Peltier effect element mounted on an inner surface of said metal casing by soldering;
    said metal casing having a Peltier effect element mounting region in the inner surface of said metal casing on which said Peltier effect element is mounted, the area of said Peltier effect element mounting region being substantially equal to that of the bottom surface of said Peltier effect element;
    wherein said Peltier effect element mounting region is raised with respect to a region adjacent thereto such that extra solder squeezed out from under the Peltier effect device during the soldering will flow away from the Peltier effect device instead of up onto the device.

2. A semiconductor laser module as claimed in claim 1, wherein a groove-shaped recess is formed along the periphery of said Peltier effect element mounting region.

3. A semiconductor laser module as claimed in claim 1, wherein only said Peltier effect element mounting region is raised with respect to the inner surface of said metal casing.

4. A semiconductor laser module as claimed in claim 1, wherein said Peltier effect element mounting region is provided on the inner surface of a bottom wall of said metal casing.

* * * * *